United States Patent [19]
Rechberger et al.

[11] Patent Number: 5,965,253
[45] Date of Patent: Oct. 12, 1999

[54] MACHINING TOOLS

[75] Inventors: Johann Rechberger, Zollikofen; Roland Dubach, Ballaigues, both of Switzerland

[73] Assignee: Vilab AG, Grenchen, Switzerland

[21] Appl. No.: 07/946,642

[22] Filed: Sep. 18, 1992

[30] Foreign Application Priority Data

Sep. 23, 1991 [CH] Switzerland ............... 2893/91

[51] Int. Cl.$^6$ ....................... B32B 9/00
[52] U.S. Cl. ............... 428/336; 51/295; 51/307; 51/309; 428/472; 428/698; 428/701; 428/702; 428/704
[58] Field of Search ................. 428/698, 336, 428/702, 704, 472, 701; 51/295, 307, 309

[56] References Cited

U.S. PATENT DOCUMENTS

| | | | |
|---|---|---|---|
| 4,324,803 | 4/1982 | Bergmann et al. | 428/472 |
| 4,820,591 | 4/1989 | Ramanarayanan | 428/628 |
| 5,002,798 | 3/1991 | Donley et al. | 427/53.1 |
| 5,100,848 | 3/1992 | Enomoto et al. | 428/701 |

FOREIGN PATENT DOCUMENTS

| | | |
|---|---|---|
| 24 15 255 | 10/1975 | Germany. |
| 715631 | 2/1980 | U.S.S.R.. |
| WO87/06273 | 10/1987 | WIPO. |

OTHER PUBLICATIONS

Database WPI, Week 8007, Jul. 30, 1979, AN–8012251C.
Derwent Database Research, SU–715631.

*Primary Examiner*—Archene Turner
*Attorney, Agent, or Firm*—Helfgott & Karas, PC.

[57] ABSTRACT

Tools having a surface coating of at least one compound containing at least one element from the main group of Group VI of the periodic table and at least one element from the subgroup of Groups V and VI of the periodic table. The coating may consist of molybdenum disulfide, for example. These tools are superior to conventional hard-solid covered tools in various respects and may be milling cutters, for example, which have an excellent edge life, even more than six times as long. Moreover, the machined surfaces have substantially less surface roughness and make it possible to work with higher feeds.

20 Claims, No Drawings

MACHINING TOOLS

BACKGROUND OF THE INVENTION

This invention relates to tools for machining materials and to a method of producing such tools.

It is generally known at the present time that hard layers on the basis of carbides, nitrides, carbonitrides, borides, silicides, and oxides of elements of Groups III–VIII of the periodic table have wear-resistant properties. Such layers or cases have very high coefficients of hardness ranging from 1,500 HV to 4,000 HV and more.

One of the most well-known fields of application worldwide is the coating of cutting tools of hard metal, high-speed steel, and tool steel with hard solids, e.g., TiC, TiN, TiNC, etc., whereby substantial improvements in edge life can be achieved. Examples of such cutting tools are reversible carbide tips, milling cutters, reamers, drills, etc. The thickness of these coatings, or combinations thereof, is preferably between 2 and 5 microns. It is limited by the ductility and adhesive strength of the coating on the substrate material. The action of the coating is attributed to the high degree of hardness and wear-resistance in that metal-to-metal contact can be avoided during machining at high pressure and occasionally high temperatures, and hence no local welding together takes place.

It has been shown in practice that in the case of certain alloys and types of steel, tools coated with hard solids do not yield the expected cutting performance. Such alloys to be machined are, for example, aluminum alloys, titanium alloys, and nickel alloys. For this reason, uncoated tools, or tools of hard metal, are frequently utilized at present for machining the aforementioned materials.

BRIEF SUMMARY OF THE INVENTION

It is an object of this invention to provide machining tools presenting alternatives to the above-mentioned prior art tools, free of the indicated drawbacks and, in addition, less expensive and easier to produce.

It has unexpectedly been found that the coating of machining tools with inorganic compounds known as lubricants and antifriction agents, such as molybdenum disulfide and the like, yields tools which are not only on a par with but frequently even superior to hard-solid coated tools.

Machine parts such as ball bearings and the like have been coated with molybdenum disulfide for lubricating purposes. Such coating is chiefly carried out nowadays by PVD (physical vapor deposition). The main field of application is currently wherever lubricants and antifriction agents are useful, but where no conventional oil- or grease-based lubricants can be used because of exterior conditions such as high temperatures, a vacuum, or a high vacuum.

USSR Patent No. 715,631 also describes steel tools made more wear-resistant by pretreating them through etching, then allowing molybdenum disulfide to diffuse into the surface. The tools are then washed, dried, and deep-frozen.

It has been found, however, that tools for machining by cutting and other material removal can be obtained by more simple coating methods. Until now, such tools could be obtained only by coating with hard solids. It was highly unexpected that by means of coatings having a Vickers hardness of less than 400, tools can be produced which are superior to conventional tools with coatings having a Vickers hardness of 1,500 and more.

DETAILED DESCRIPTION

The machining tools according to the present invention are coated with a pure surface coating comprising at least one compound composed of at least one main element of Group VI of the periodic table, on the one hand, and a sub-group element of Groups V and VI of the periodic table, on the other hand.

The method of producing such tools comprises the step of coating the tools by means of physical vapor deposition.

Main elements of Group VI of the periodic table entering into consideration are oxygen, sulfur, selenium, and tellurium. Entering into consideration as subgroup elements of Groups V and VI of the periodic table are vanadium, niobium, tantalum, chromium, molybdenum, and tungsten. Typical representatives of compounds suitable for the coating are $MoS_2$, $NbS_2$, $TaS_2$, $WS_2$, $MoSe_2$, $NbSe_2$, $TaSe_2$, $WSe_2$, $MoTe_2$, $NbTe_2$, $TaTe_2$, and $WTe_2$, or mixed compounds thereof.

Preferably utilized for coating the tools, particularly reversible carbide tips, milling cutters, reamers, and drills, is molybdenum disulfide, known as a lubricant and antifriction agent. With a Mohs hardness of 1–2, molybdenum disulfide is a very soft substance and has a very low coefficient of friction which is dependent upon the ambient conditions: in a vacuum it is 0.01–0.04, in dry air 0.01–0.04, in humid air 0.2–0.3 (relative humidity 50%). Unlike the hard-solid coatings, the functional coating thickness is very slight and ranges from 0.1 to 1 micron. For many applications, the life of the inventive machining tools is unexpectedly many times longer than that of prior art tools of hard metal or having a hard-solid coating. Hence the invention not only reduces material consumption but also makes it possible to cut down on interruptions of automatically controlled machining operations to replace worn-out tools, thus increasing productivity.

For producing the inventive machining tools, they are normally fabricated on steel, e.g., HSS steel, and then coated with $MoS_2$ by the PVD process. In this process, thin layers are applied by cathode sputtering at relatively low process temperatures, below 550° C. The process does not cause any deformation on the tool, so that no aftertreatment is necessary. A closed field unbalanced magnetron installation has proved particularly advantageous for the deposition of MoS2 coatings and the like in producing the inventive tools. A high degree of ionization can be achieved thereby at low gas pressure, thus leading to the formation of compact coatings with good adhesion. The coating composition can also be optimally controlled and monitored with this multiple-magnet system.

Preferred embodiments of the invention will now be illustrated in detail by the following non-limitative examples. A comparison of the inventive tools with analogous tools of hard metal demonstrates the unexpected superiority of the inventive tools.

In each of the following Examples 1 and 2, a workpiece made of the indicated malleable aluminum alloy was machined with a $MoS_2$-coated milling cutter according to the present invention. By way of comparison, the same operation was repeated with a conventional tool of hard metal.

EXAMPLE 1

| Alloy: | Anticorodal 112 Material No. 3.2315 | |
|---|---|---|
| Working Conditions | Hard Metal | MoS$_2$-coated High-speed Steel |
| Feed | 2,300 mm/min | 5,000 mm/min |
| Speed of rotation | 10,000 rpm | 10,000 rpm |
| Cutter diameter: 8 mm | Slot dimensions: | width = 2 mm depth = 8 mm |

EXAMPLE 2

| Alloy: | Anticorodal 112 Material No. 3.2315 | |
|---|---|---|
| Working Conditions | Hard Metal | MoS$_2$-coated High-speed Steel |
| Feed | 2,100 mm/min | 5,000 mm/min |
| Speed of rotation | 12,000 rpm | 11,300 rpm |
| Cutter diameter: 8 mm | Slot dimensions: | width = 2 mm depth = 8 mm |

EXAMPLE 3

A workpiece of the malleable aluminum alloy Anticorodal 112 was machined with a MoS$_2$-coated HSS milling cutter according to the present invention. By way of comparison, the same operation was repeated with an analogous tool, once uncoated and once coated with TiN. The results showed that the workpiece machined with the cutter coated with MoS$_2$ had the least surface roughness.

| Alloy: | Anticorodal 112 Material No. 3.2315 HSS tool | |
|---|---|---|
| Working conditions: | feed: | 1,075 mm/min |
| | speed of rotation: | 4,000 rpm |
| | slot dimensions: | width 6 mm depth 16 mm |
| | cutter diameter: | 10 mm |
| Roughness after a cutter course of 15 meters: | | |
| HSS without MoS$_2$: | R$_a$ = 5–6 microns | |
| with TiN: | R$_a$ = 4–6 microns | |
| with MoS$_2$: | R$_a$ < 2 microns | |

It follows clearly from the foregoing examples that an increase in efficiency was brought about by the inventive tools. This is unexpected for one skilled in the art inasmuch as increases in efficiency for such tools have always been attributed in the past to the application of still harder coatings.

EXAMPLE 4

A tool of HSS steel was coated with MoS$_2$ by means of PVD, a tool being obtained such as was utilized in the foregoing examples. A closed field unbalanced magnetron installation was used for this purpose, having a symmetrical vertical 4-magnetron reactor with an interior volume of 250 lt. Argon at a pressure of 0.27 Pa (2·10$^{-3}$ Torr) was used as the process gas. The total magnetron output was 4 kW. Pure MoS$_2$ was utilized as the target. The substrate temperature was <250° C. and the substrate bias voltage <50V DC.

In comparison with the prior art hard-solid coatings, molybdenum disulfide coatings exhibit the following differing characteristics:

| | MoS$_2$ | Hard-solid layer |
|---|---|---|
| Hardness | 1–2 Mohs | >1500 Vickers |
| Thickness | .1–1 micron | 3–5 microns |

The coefficient of friction at 50% relative humidity, on the other hand, is about the same, viz., MoS$_2$: 0.2–0.3; hard-solid layer (TiC): 0.25.

A comparison of cutting tools in machining a platinum alloy also turned out to be significant. During machining with a tool having a hard-solid layer, a cutting rate of 30 m/min and a feed of 144 mm/min was reached. The tool already had to be reground after only three operations. When a tool according to the present invention was used, having a molybdenum disulfide coating, a cutting rate of 94 m/min and a feed of 1,000 mm/min could be achieved, the tool still being just as usable even after ten operations.

The following table gives performance data for circumferential milling (with cooling) of aluminum alloys (low silicon content) with typical representatives of the inventive tools, viz., slot cutter F 1332 manufactured by Usines Metallurgiques de Vallorbe, CH-1337 Vallorbe, Switzerland, with various cutter diameters D. The intended cutting depth was D x 0.25D:

| Cutting Data for Slot Cutter during Circumferential Milling (D x .25D) | | | | |
|---|---|---|---|---|
| Z | D | Vc (m/min) | n (rpm) | Vf (mm/min) |
| 3 | 6 | 150–230 | 7950–12200 | 3100–4800 |
| 3 | 8 | 170–250 | 6750–7950 | 3500–5300 |
| 3 | 10 | 220–330 | 7000–10500 | 4500–6800 |
| 3 | 12 | 250–386 | 6600–10200 | 4250–7400 |
| 3 | 14 | 250–386 | 5700–8800 | 5100–7900 |
| 3 | 16 | 250–386 | 4950–7650 | 5150–7950 |
| 3 | 18 | 250–386 | 4400–6800 | 5100–7600 |
| 3 | 20 | 250–386 | 3950–6100 | 5200–8000 |
| 3 | 25 | 250–386 | 3200–4600 | 5200–8000 |
| 3 | 32 | 250–386 | 2500–3800 | 5200–7900 |
| 3 | 40 | 250–386 | 2000–3000 | 5200–7900 |

Z = number of teeth
D = diameter of cutter
Vc = cutting rate
n = speed of rotation
Vf = feed The tool of this invention may also have a functional layer disposed beneath the surface coating and comprised of a hard solid material composed of elements from the group consisting of carbides, nitrides, carbonitrides and oxides.

In a further embodiment of the invention, the surface coating is covered by an oil-based rust-preventative. Alternatively, the surface coating may be coated by an oil-based lubricant.

What is claimed is:

1. A tool having improved wear resistance for metal-cutting machining of materials, comprising:

a surface coating on said tool comprising at least one compound containing at least one element from the main group of Group VI of the periodic table and at least one element from the subgroup of Groups V and VI of the periodic table.

2. The tool as claimed in claim 1, wherein:

said surface coating has a thickness of from 0.1 to 10 microns.

3. The tool as claimed in claim 2, wherein:

said surface coating has a thickness of 1 micron.

4. The tool as claimed in claim 1, and further comprising:

a functional layer disposed beneath said surface coating and comprising a hard solid selected from the group consisting of carbides, nitrides, carbonitrides, and oxides.

5. The tool as claimed in claim 1, wherein:

said surface coating is covered by an oil-based rust-preventative.

6. The tool as claimed in claim 1, wherein:

said surface coating is covered by an oil-based lubricant.

7. The tool as claimed in claim 1, wherein:

said at least one compound comprises at least one element selected from the group consisting of oxygen, sulfur, selenium, and tellurium, and at least one element selected from the group consisting of vanadium, niobium, tantalum, chromium, molybdenum, and tungsten.

8. The tool as claimed in claim 7, wherein:

said surface coating comprises molybdenum disulfide of stoichiometric or non-stoichiometric composition.

9. The tool as claimed in claim 7, and further comprising:

a functional layer disposed beneath said surface coating and comprising a hard solid selected from the group consisting of carbides, nitrides, carbonitrides, and oxides.

10. The tool as claimed in claim 7 wherein:

said surface coating comprises molybdenum disulfide of stoichiometric or non-stoichiometric composition;

said surface coating comprises at least one compound selected from the group consisting of $MoSe_2$, $NbSe_2$, $TaSe_2$, $WSe_2$, $NbS_2$, $TaS_2$, $WS_2$, $MoTe_2$, $TaTe_2$, and $WTe_2$;

said at least one compound is a pure compound containing no organic or inorganic binding agent;

said surface coating has a thickness of from 0.1 to 10 microns; and said surface coating is covered by an oil-based rust-preventative.

11. The tool as claimed in claim 10, and further comprising:

a functional layer disposed beneath said surface coating and comprising a hard solid selected from the group consisting of carbides, nitrides, carbonitrides, and oxides.

12. The tool as claimed in claim 7, wherein:

said surface coating comprises at least one compound selected from the group consisting of $MoSe_2$, $NbSe_2$, $TaSe_2$, $WSe_2$, $NbS_2$, $TaS_2$, $WS_2$, $MoTe_2$, $TaTe_2$, and $WTe_2$.

13. The tool as claimed in claim 12, wherein:

said at least one compound is a pure compound containing no organic or inorganic binding agent.

14. The tool as claimed in claim 12, and further comprising:

a functional layer disposed beneath said surface coating and comprising a hard solid selected from the group consisting of carbides, nitrides, carbonitrides, and oxides.

15. The tool as claimed in claim 14, wherein:

said surface coating is covered by an oil-based rust-preventative.

16. The tool as claimed in claim 14, wherein:

said surface coating is covered by an oil-based lubricant.

17. A tool having improved wear resistance for metal-cutting machining of materials selected from the group consisting of aluminum alloys, titanium alloys, platinum and alloys thereof, and copper alloys, said tool having a surface coating comprising at least one compound containing at least one element from the main group of Group VI of the periodic table and at least one element from the subgroup of Groups V and VI of the periodic table, made by the method comprising:

coating said tool by physical vapor deposition with at least one compound of said at least one element from the main group of Group VI of the periodic table and said at least one element from the subgroups of Groups V and VI of the periodic table.

18. The tool made by the method as claimed in claim 17 and further comprising:

coating said tool with a hard-solid layer prior to said physical vapor deposition of said surface coating.

19. The tool made by the method as claimed in claim 17 wherein:

said coating step comprises physical vapor deposition of molybdenum disulfide.

20. The tool made by the method as claimed in claim 17 wherein:

said physical vapor deposition comprises depositing a coating of at least one compound selected from the group consisting of $MoSe_2$, $NbSe_2$, $TaSe_2$, $WSe_2$, $NbS_2$, $TaS_2$, $WS_2$, $MoTe_2$, $NbTe_2$, $TaTe_2$ and $WTe_2$.

* * * * *